United States Patent [19]

Mori

[11] Patent Number: 5,016,068
[45] Date of Patent: * May 14, 1991

[54] VERTICAL FLOATING-GATE TRANSISTOR

[75] Inventor: Kiyoshi Mori, Stafford, Tex.

[73] Assignee: Texas Instruments Incorporated, Dallas, Tex.

[ * ] Notice: The portion of the term of this patent subsequent to May 14, 2008 has been disclaimed.

[21] Appl. No.: 449,135

[22] Filed: Dec. 8, 1989

Related U.S. Application Data

[63] Continuation of Ser. No. 181,789, Apr. 15, 1988, abandoned.

[51] Int. Cl.⁵ .................. H01L 27/115; H01L 29/788
[52] U.S. Cl. .................................. 357/23.5; 357/23.4
[58] Field of Search .................. 357/23.5, 23.6, 23.4, 357/23.1, 55, 23.8

[56] References Cited

U.S. PATENT DOCUMENTS

| | | | |
|---|---|---|---|
| 3,518,509 | 6/1970 | Cullis | 357/23.4 |
| 4,222,062 | 9/1980 | Trotter | 357/23.5 |
| 4,334,235 | 6/1982 | Nishizawa | 357/23.1 |

FOREIGN PATENT DOCUMENTS

| | | | |
|---|---|---|---|
| 2003068 | 11/1969 | France | 357/23.4 |
| 56-29362 | 3/1981 | Japan | 357/23.4 |
| 61-142774 | 6/1986 | Japan | 357/23.4 |

OTHER PUBLICATIONS

Ammar et al., IEEE Transactions on Electron Devices, vol. ED27, No. 5, May 1980, pp. 907-914.
Rodgers et al., IEEE Journal of Solid State Circuits, vol. SC12, No. 5, Oct. 1977, pp. 515-524.
IBM Tech. Discl. Bul., vol. 14, No. 3, Aug. 1971, p. 751, "High Speed Epitaxial Field-Effect Devices", Magdo et al.

*Primary Examiner*—William D. Larkins
*Attorney, Agent, or Firm*—Theodore D. Lindgren; Thomas W. Demond; Melvin Sharp

[57] ABSTRACT

An electrically erasable, progammable, read-only-memory, floating-gate, metal-oxide-semiconductor transistor constructed in a trench extending through layers of P-type and N-type material formed on a semiconductor substrate. The floating-gate transistor is comprised of two source-drain regions, a channel region, a floating gate, a programming gate, and gate-oxide layers and is characterized by a floating-gate to channel capacitance that is small relative to the programming-gate to floating-gate capacitance, thereby allowing charging of the floating gate using programming and erasing voltages of less magnitude than might otherwise be necessary.

9 Claims, 3 Drawing Sheets

VERTICAL FLOATING-GATE TRANSISTOR

This application is a continuation of U.S. Pat. application Ser. No. 181,789, filed on Apr. 15, 1988, now abandoned.

This invention is related to my U.S. Pat. application Ser. No. 449,124, entitled "Vertical MOS Transistor", filed Dec. 12, 1989, which is a continuation of U.S. Pat. application Ser. No. 07/180,424, filed Apr. 11, 1988, which is a continuation of U.S. Pat. application No. 921,728, Filed Oct. 21, 1986, and which is also assigned to Texas Instruments Incorporated.

BACKGROUND OF THE INVENTION

This invention relates to integrated-circuit field-effect transistors having floating gates, and more particularly to floating-gate field-effect transistors formed on the vertical walls of trenches formed in layers of doped semiconductor material.

Floating-gate, avalanche-injection, metal-oxide-semiconductor (FAMOS) transistors are commonly used in erasable programmable read-only-memories (EPROMs) and in electrically erasable programmable read-only-memories (EEPROMs). The floating gates of such devices are located between the programming gates and the transistor channels and are separated from the programming gates and from the transistor channels by layers of silicon dioxide or other electrically insulating material. During programming of an EPROM, a large voltage of sufficient positive magnitude is applied to the programming gate to cause negatively charged electrons to be transferred from the source-channel-drain region to the floating gate. The charge on a floating gate of an EPROM may be erased by allowing light or other radiation to enter the floating-gate region. The charge on the floating gate of an EEPROM may be erased by applying a voltage of sufficient negative magnitude to the programming gate to cause the excess electrons in the floating gate to transfer to the source-channel-drain region. In general, prior-art EEPROMs are characterized by configurations that, during programming and erasing, restrict the charge transfer to a particular path between the source-channel-drain region and the floating gate.

EPROMs and EEPROMs are usually formed on planar substrates with the source-channel-drains and gate surfaces having horizontal geometries. Horizontal formation of gates and source-channel-drain regions requires use of a relatively large area on the surface of a microchip for each transistor. As the component density of integrated-circuit memory arrays increases, it is necessary to decrease the area used by each transistor.

In addition, use of horizontal-geometry structures limits the ability of the designer to increase the floating gate-to-channel electric field during programming/erasing while at the same time limiting the magnitude of programming/erasing voltages. In order to limit the programming-gate voltages to reasonably safe values during programming and erasing and at the same time create floating gate-to-channel electric fields of sufficient magnitude to cause tunneling of electric charge, designers of prior-art planar structures have added separate tunneling areas having relatively short dimensions between the floating gate and a part of the source-channel-drain surface.

While the prior art discloses formation of vertical transistors having gate and source-channel-drain surfaces formed on the vertical walls of a trench for the purpose of decreasing the area required for those transistors, no known disclosure includes formation of a floating-gate transistor on a vertical wall of a trench in a manner that increases the floating gate-to-channel electric fields during programming and erasing while at the same time limiting the magnitude of programming-gate voltages applied during programming and erasing to reasonably small values without use of a separate tunneling area.

SUMMARY OF THE INVENTION

In accordance with this invention, a floating-gate transistor is constructed in a trench extending through layers of P-type and N-type material formed on a substrate. The transistor is comprised of two source-drain layers, a channel layer, a floating gate, a programming gate, and gate-oxide regions. The structure permits relatively large charge-storing capacity in a relatively small area of an integrated-circuit chip and, in preferred embodiment, results in a relatively large electric field between the floating gate and the source-channel-drain surface upon application of a reasonably small magnitude of voltage to the programming gate.

BRIEF DESCRIPTION OF THE DRAWINGS

The novel features of this invention are set forth in the appended claims. The invention, its features, and its advantages are described below in conjunction with the following drawings:

DETAILED DESCRIPTION OF SPECIFIC EMBODIMENTS

Figure 1:
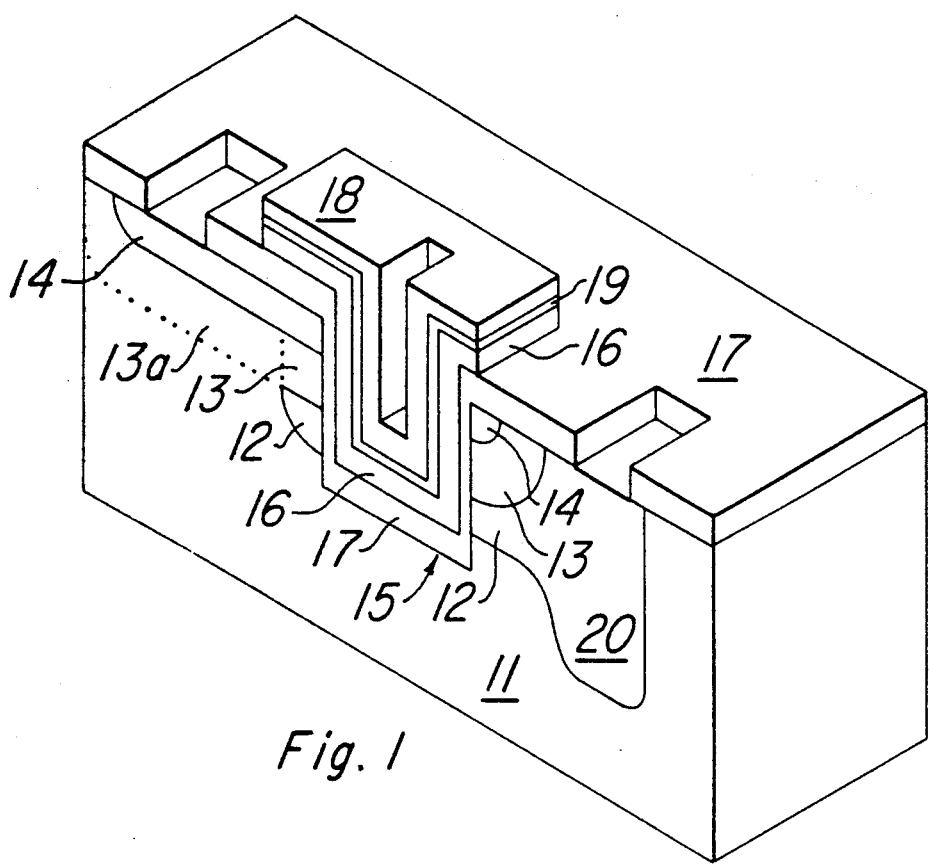
FIG. 1 is an isometric view, in section, of a floating-gate transistor constructed in accordance with this invention.
Figure 2:
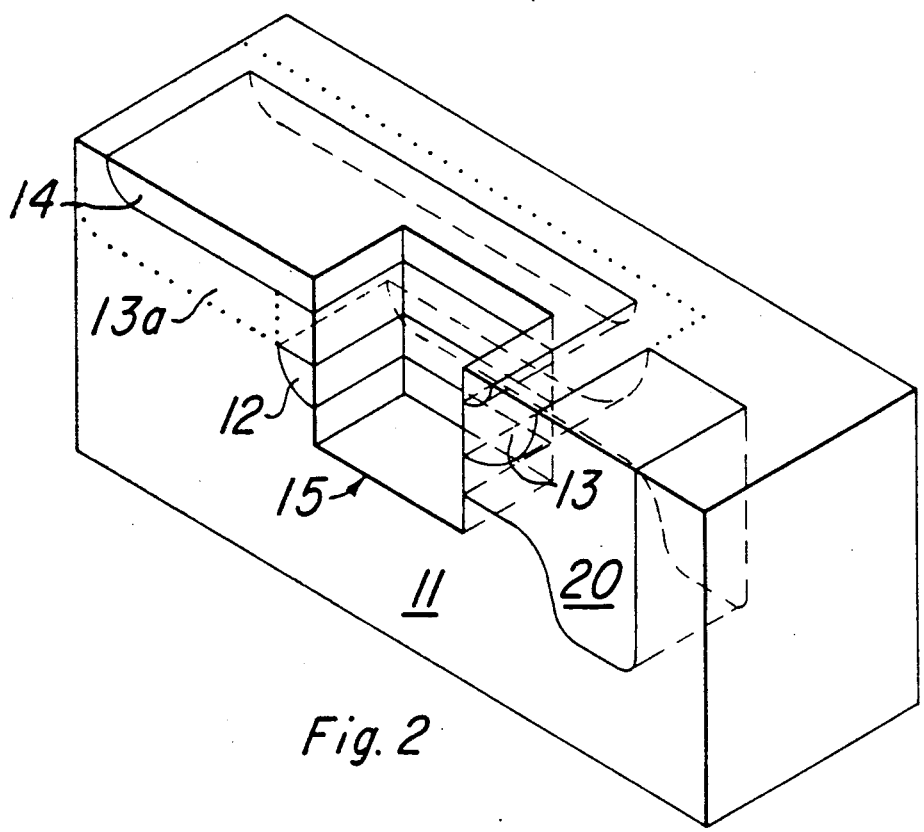
FIG. 2 is an isometric view, in section, of the floating-gate transistor of FIG. 1 at the stage of construction after the trench has been removed through layers of doped semiconductor material.

Referring to FIGS. 1 and 2, a vertical floating-gate, metal-oxide-semiconductor field-effect transistor according to this invention is shown formed in a surface of a silicon substrate layer 11 with lower source-drain region 12, channel region 13, and upper source-drain region 14 formed therein. Trench 15 extends through the top and bottom parallel surfaces of upper source-drain region 14; through the top and bottom parallel surfaces of adjacent channel region 13; and through the top, and preferably bottom, parallel surfaces of adjacent lower source-drain region 12. Extension of trench 15 through the bottom parallel surface of lower source-drain region 12 will minimize undesired capacitive coupling.

Lower source-drain region 12 has an extension 20 that extends to a point on the surface of substrate 11 away from trench 15. Channel region 13 also has an extension to the surface of substrate layer 11, the region 13 extension separating extension 20 from trench 15. Source-drain region 14 is illustrated as surrounding trench 15 and functions to separates the extension of channel region 13 from the upper part of trench 15.

The illustrations of the Figures are representative. For example, the boundaries of the internal regions of doped semiconductor materials may not, in practice, have sharp corners as indicated by the dotted lines of FIG. 2.

Referring now to FIG. 1, floating gate 16 is separated from the vertical source-channel-drain wall of trench 15 by first gate oxide layer 17. Programming gate 18 is separated from floating gate 16 by second gate oxide layer 19. Source-drain region 12 may be either the source or the drain of the transistor 10, with source-drain region 14 serving in the opposite capacity. Regions 12, 13 and 14 are of alternating P-type and N-type doped semiconductor material with channel region 13 having either primarily P-type or N-type doping.

Floating gate 16 is programmed or charged by applying a voltage to programming gate 18 such that the electric field between floating gate 16 and channel layer 13 is sufficient to cause electrons to be transferred from the lateral trench boundary of channel layer 13 to floating gate 16. The electric field between floating gate 16 and the lateral trench boundary of channel region 13 is approximated by dividing the voltage between gate 16 and region 13 by the appropriate thickness of first gate oxide layer 17. The voltage between floating gate 16 and the lateral trench boundary of channel region 13 is approximated by multiplying the voltage applied to programming gate 18 by the value of the capacitance between programming-gate 18 and floating-gate 16, then dividing the product by the sum of the floating-gate 16 to channel-region 13 capacitance and the programming-gate 18 to floating-gate 16 capacitance. Therefore, the voltage between floating gate 16 and the lateral trench boundary of channel region 13 is a greater fraction of the applied programming voltage if the capacitance or area of the adjacent charged surfaces of programming gate 18 and floating gate 16 is large with respect to the capacitance or area of the adjacent charged surfaces of floating gate 16 and the lateral trench boundary of channel region 13. It follows that if the voltage between floating gate 16 and the lateral trench boundary of channel layer 13 is a greater fraction of the voltage applied to programming gate 18, then the electric field will be greater for a given thickness of first gate oxide layer 17.

Floating gate 16 is erased or discharged by applying a voltage of programming gate 18 such that electrons trapped on gate 16 will be removed to the source-channel-drain regions 12, 13, 14. The voltage division described above for programming operation also applies to erasing operation.

The ratio of the relevant gate-to-gate and gate-to-channel capacitances of prior-art horizontal geometry floating-gate transistors is generally close to unity because of the impossibility of making the relevant surface of one capacitance greater than the relevant surface of the other capacitance. Attempts to adjust the capacitance by decreasing the thickness of the gate oxide between the programming gate and the floating gate result in decreasing the insulation capability of the gate oxide in inability of the floating gate to hold its charge for long periods of time. Similarly, the prior-art addition of separate charging electrodes to floating gates and source-channel-drain surfaces results in greater possibility of charge leakage from the floating gate because of the narrow distance between electrodes and because of the increased adverse effect of any contamination of the insulated region between electrodes.

The capacitance between programming gate 18 and floating gate 16 of FIG. 1 is much greater than the capacitance between floating gate 16 and the trench surface of channel layer 13 because the vertical geometry permits the relevant charged-surface areas differ greatly. First and second gate oxide layers 17 and 19 may both be of minimum and equal thickness required for floating gate 16 to hold a programmed charge for a sufficient length of time. Therefore, the invention described and claimed herein permits programming and erasing using smaller-magnitude voltages applied to programming gate 18 to create proportionally larger electric fields in first gate oxide layer 17.

The capacitance between floating gate 16 and channel region 13 may be decreased in the structure of FIG. 1 by increasing the thickness of insulating oxide 17 at the bottom of trench 15. At the same time, undesirable capacitances between upper source-drain region 14 and gates 16 and 18 may be decreased by increasing the thickness of insulating oxide 17 in that region. A method for accomplishing the increased thickness of insulating oxide 17 in the regions at the bottom of trench 15 and at the upper surface of source-drain region 1 is described in part in my co-pending U.S. Pat. application Ser. No. 161,706, filed Feb. 29, 1988 and also assigned to Texas Instruments Incorporated. As described in that Application, a layer of insulating oxide may be deposited by chemical vapor deposition following formation of the trench. Use of equipment of earlier manufacture to deposit the layer of oxide will result in thicker formation of oxide on the horizontal surfaces than on the vertical surfaces. The oxide formed on the vertical surface may be removed by a short etch cycle, then replaced with a better quality thermally grown oxide, both steps using well-known technology.

Connection to lower source-drain region 12 may include vertical doped semiconductor extension region 20. Extension 20 is described in my co-pending U.S. Pat. application Ser. No. 07/449,124, also assigned to Texas Instruments Incorporated.

Figure 3A:
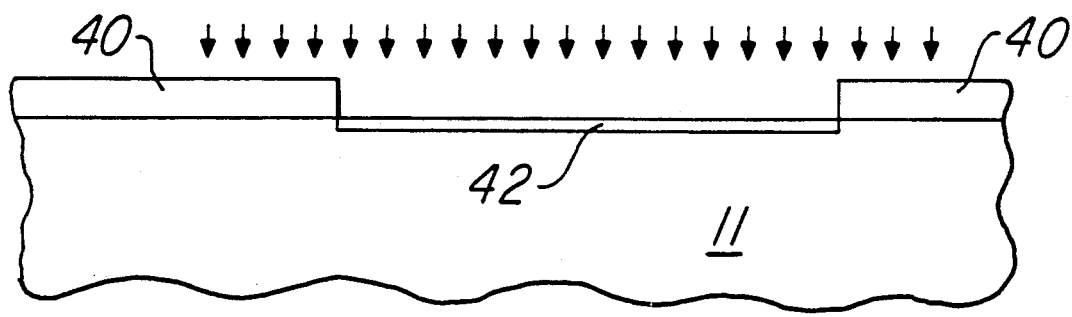
FIGS. 3a–3h are elevation views, in section, of the chip corresponding to FIG. 1 at various stages in manufacture.

Referring now to FIGS. 3a–3h, an example method for constructing the floating-gate transistor of FIG. 1 is described. FIG. 3a is a cross-sectional view of substrate 11, showing a masking layer 40 which is defining the area of source-drain region 12, 20. Substrate 11 is preferably single crystal silicon, having <100> orientation, and being lightly doped with P-type material for construction of a transistor with channel of P-type material. Masking layer may include a layer of photoresist which is exposed to light to form the areas of the substrate to be implanted with impurities. FIG. 3a shows substrate 11 exposed to a beam of energized phosphorus ions represented by arrows. A typical dose is 4E11 ions/cm$^2$, at an energy level of 40 keV, which can be provided by existing implantation equipment using one or the methods well known in the art. Doped layer 42, a region near the surface of substrate 11 doped with phosphorous ions, results from the ion implantation.

Figure 3B:
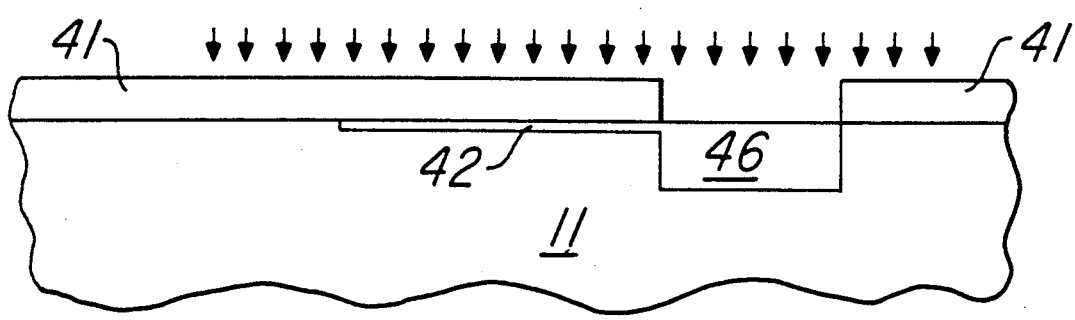
Figure 3C:
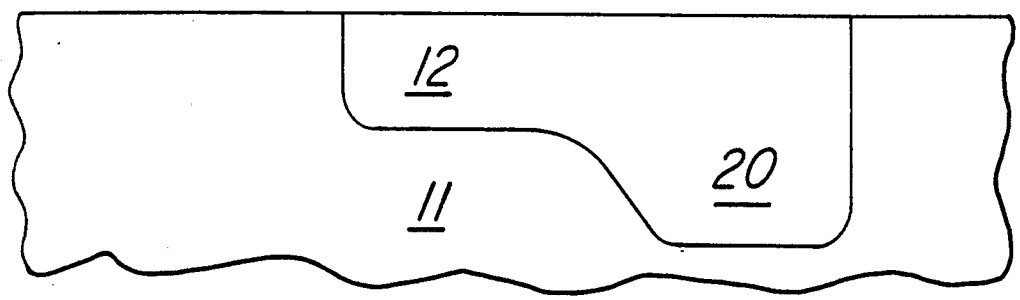

Referring now to FIG. 3b, a second ion implantation step is shown. Masking layer 40 is removed from the surface of substrate 11, and masking layer 41 is placed on the surface of substrate 11 in the position shown in FIG. 3b. A second ion implantation is performed using phosphorous ions at a dose of 8E11 ions/cm$^2$ and at an energy of 150 keV. This increased dosage level at higher energy may also be provided by existing ion implantation equipment using methods well known in the art. Doped layer 46 results from this second implantation, and extends deeper into substrate 11 because of higher implant energy. After the two phosphorous ion implant steps, a drive-in diffusion is done, which serves not only to anneal substrate 11 in order to repair damage to the crystal lattice structure caused by the implant, but also serves to cause the implanted phosphorous ions to diffuse to the desired depth, forming lower source-drain region 12, 20. The drive-in diffusion may, of course, be at any temperature and time duration necessary to establish the proper junction depth; typical conditions are a temperature of 1000 degrees Celsius for 800 minutes. N-type lower source-drain region 12, 20, shown in FIG. 3c is thus defined.

Figure 3D:
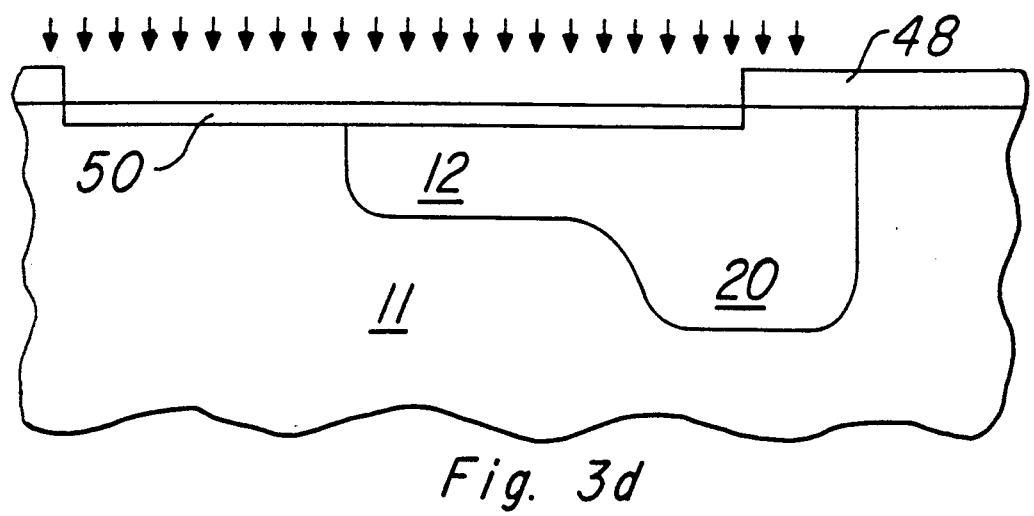
Figure 3E:
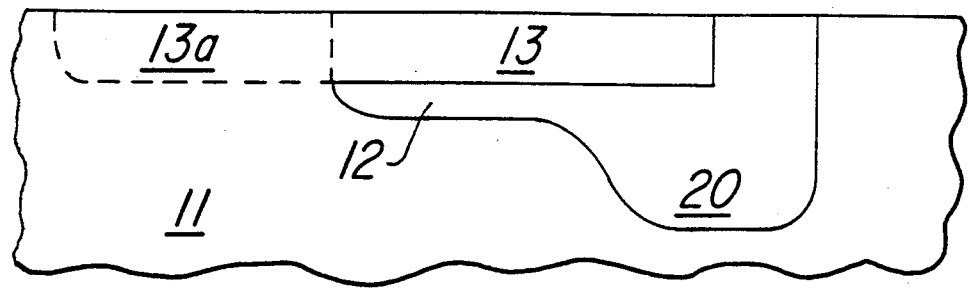

Referring now to FIG. 3d, the process for establishing channel region 13 is now described. Masking layer 48 is deposited as described above, and substrate 11 is implanted with boron ions (boron being a P-type dopant) as indicated by the arrows in FIG. 3d. A typical dose is 1E13 ions/cm$^2$, at an energy of 50 keV. This implant step is sufficient to cause the implanted surface of substrate 11 in lower source-drain region 12, 20 to become P-type again, as indicated by doped layer 50. A drive-in diffusion at 900 degrees Celsius for 60 minutes is performed after the implant. It should be noted that this diffusion will also serve to further diffuse the phosphorous ions of lower source-drain region 12, 20. After the drive-in diffusion for the implanted boron ions, channel region 13 is formed as shown in FIG. 3e. Region 13a of enhanced P-type impurity is also formed during this step.

Figure 3F:
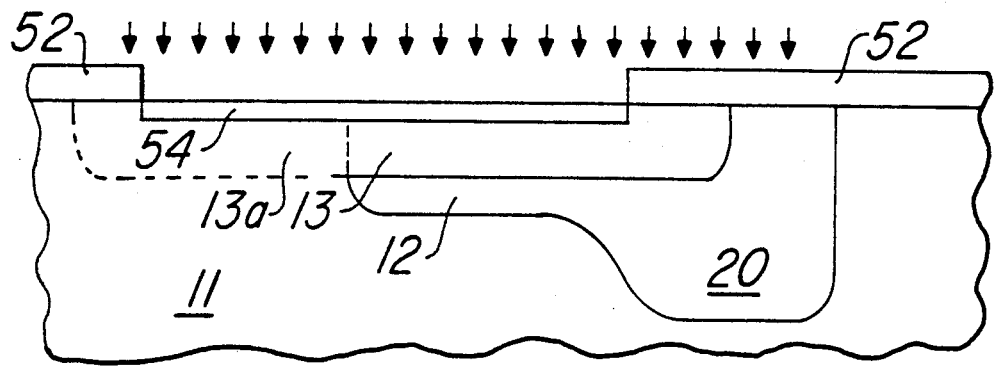
Figure 3G:
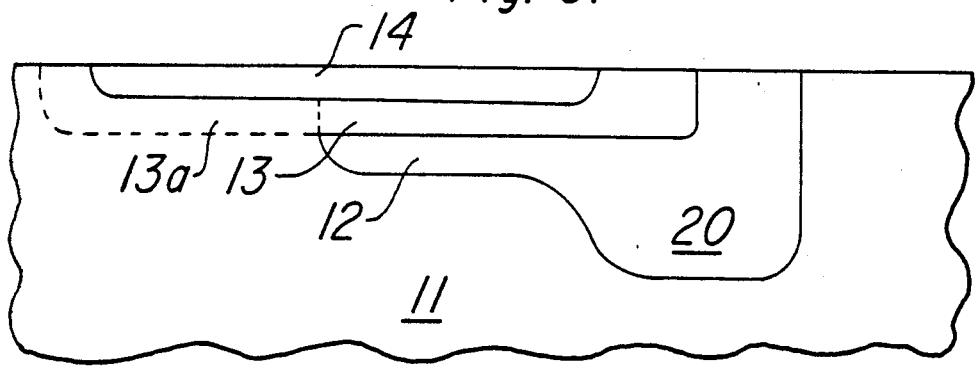

Referring to FIG. 3f, upper source-drain region 14 is formed next. Masking layer 52 is placed on the surface of substrate 11 as discussed above, prior to the ion implantation. The implantation necessary to form upper source-drain region 14 requires N-type dopants such as arsenic or phosphorus; in this embodiment, arsenic is the preferred dopant. A typical dose of arsenic ions is 8E15 ions/cm$^2$ at an energy of 150 keV. Doped layer 54, shown in FIG. 3f, results from this arsenic implant. As is evident from FIG. 3f, the implanted regions 13 and 13a of substrate 11 become N-type. Another drive-in diffusion is performed after the arsenic implant, typically at 900 degrees Celsius for 500 minutes. After this diffusion, upper source-drain region 14 is formed as shown in FIG. 3g. Again, the arsenic drive-in diffusion also serves to further diffuse the phosphorus and boron ions previously implanted and diffused; however, the times and temperatures of all diffusion steps, as well as the implant doses and energies, are all designed taking into account the further diffusion.

Figure 3H:
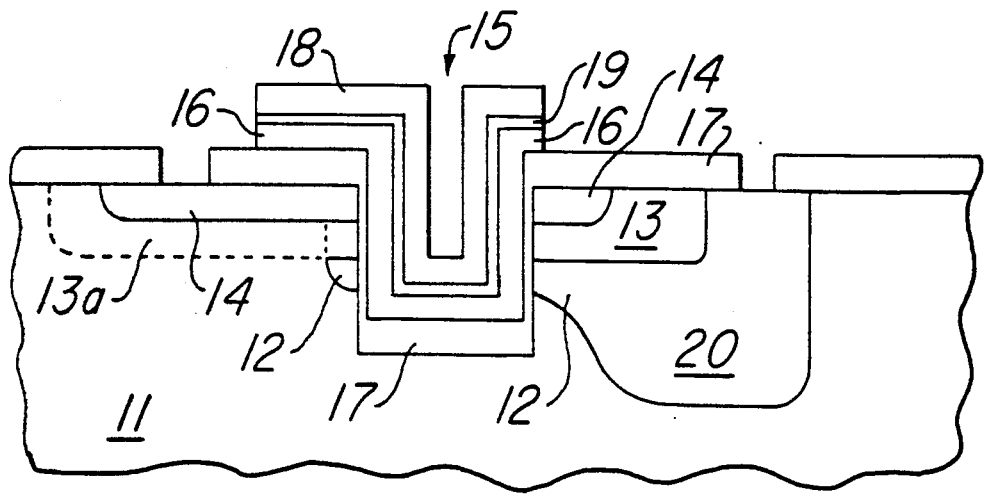

Referring now to FIG. 3h, the components of the floating gate 16 of the transistor are shown added to the structure of FIG. 3g. Trench 15 is etched into the surface of substrate 11, through the top and bottom parallel surfaces of upper source-drain region 14, channel region 13 and lower source-drain region 12, 20, and extending in depth, measured from the surface of substrate 11, below lower-source drain region 12, 20 in the area of the trench 15. The area of trench 15 is defined by photolithographic techniques, similar to those explained above relative to the ion implantation steps, so that a protective masking layer covers the surface of substrate 11 except for the area at which trench 15 is to be etched. After the masking layer is in place, substrate 11 is etched, by methods well-known in the art, to create trench 15. In FIG. 3h, trench 15 is shown as having substantially vertical sidewalls; as will be explained below, trench 15 need not have vertical sidewalls for a transistor constructed according to the invention to properly operate and have the advantages of the invention, but the vertical sidewall construction is more surface-area efficient, and provides the shortest channel length transistor. The masking layer for the etching of trench 15 is then removed.

At this point in the procedure, the threshold voltage of the device may be adjusted according to the teachings of my copending U.S. Pat. application Ser. No. 161,706, filed Feb. 24, 1988 and also assigned to Texas Instruments Incorporated.

Substrate 11 may be subjected to a high temperature environment such that silicon oxide is grown to form gate oxide 17. In the alternative, gate oxide 17 may be formed by any other technique or combination of techniques well-known in the art, which technique or techniques will result in a high quality oxide layer of approximately 100 Angstroms thickness on the vertical walls of trench 15. Gate oxide 17 may be deposited by chemical vapor deposition only rather than grown, but a grown oxide is generally preferred from an oxide quality standpoint. Whether grown or deposited; it should be noted that the oxide layer will form on the top surface of substrate 11 including the top parallel of upper source-drain region 14; on the lateral trench boundaries of upper source-drain region 14, of channel region 13 and of lower source-drain region 12, 20; and on the lower surface of trench 15; as shown in FIG. 3h. A procedure for using both deposition and grown oxides to form an oxide that is thicker at the bottom surface of trench 15 and at the upper surface of upper source-drain region 14 has been described above.

Subsequent to growth of gate oxide 17, a layer of polysilicon is deposited over the surface of substrate 11, and is patterned and etched by methods well-known in the art to leave floating-gate electrode 16 covering gate oxide 17 within trench 15, as shown in FIG. 3h.

Second oxide layer 19 is then formed using one or more of the methods described above for forming first oxide layer 17. A second layer of polysilicon is then deposited over the surface of substrate 11, and is patterned and etched by methods well-known in the art to leave programming-gate electrode 18 covering oxide 19, as shown in FIG. 3h. Programming gate 18 may be patterned and etched as part of a word line or other electrical conductor in one of the manners also well-known in the art.

By using the process parameters described above, a floating-gate transistor having the features shown is FIG. 1 and described above may be constructed. The depth of the source-drain and channel layers may each range from 0.15 to 0.30 micron depending on the processing technique utilized.

Subsequent to the construction of the basic elements of the floating-gate transistor as described above, electrical connection to programming gate 18 and to source-drain regions 14 and 12, 20 must be made. The fabrication techniques for making such connections are numerous and any suitable technique may be used.

While the description above has described a structure constructed to form a transistor with channel of P-type material, it is obvious that the teachings of the invention apply to transistors with channels of N-type material.

While this invention has been described with respect to an illustrative embodiment, this description is not intended to be construed in a limiting sense. Upon reference to this description, various modifications of the illustrative embodiment, as well as other embodiments of the invention, will be apparent to persons skilled in the art. It is contemplated that the appended claims will cover any such modifications or embodiments that fall within the scope of the invention.

I claim:

1. A semiconductor floating-gate field-effect transistor comprising:
   a semiconductor substrate of a first conductivity-type, said semiconductor substrate having a trench with substantially vertical sidewalls formed at a surface thereof;
   a first doped region disposed within said semiconductor substrate, said first doped region having a bottom parallel surface at a predetermined depth from said surface of said semiconductor substrate shallower than the depth of said trench, having a top parallel surface at a predetermined depth from said surface of said semiconductor substrate, having a lateral boundary between said parallel surfaces to form a part of the wall of said trench, and having an extension to said surface of said substrate at a point away from said trench, said first doped region being of a second conductivity-type, said second conductivity-type being opposite to said first conductivity-type;
   a second doped region of said first conductivity-type disposed within said semiconductor substrate, said second doped region having a bottom parallel surface adjacent to said top parallel surface of said first doped region, having a top parallel surface at a predetermined depth below said surface of said substrate, having a lateral boundary between parallel surfaces to form a part of the wall of said trench, and having an extension to said surface of said substrate at a point between said surface extension of said first doped region and said trench;
   a third doped region of said second conductivity-type disposed within said semiconductor substrate, said third doped region having a bottom parallel surface adjacent to said top parallel surface of said second doped region, having a top parallel surface at said surface of said semiconductor substrate, and having a lateral boundary between said parallel surfaces to form a part of the wall of said trench, said top parallel surface between said surface extension of said second doped region and said trench;
   a first insulating layer disposed on the walls of said trench and covering said lateral boundaries of said first, second and third doped regions and disposed at the bottom of said trench;
   a first conductive layer disposed adjacent to said first insulating layer along at least said walls of said trench opposing said first, second and third doped regions;
   a second insulating layer disposed adjacent to said first conductive layer opposing said first insulating layer;
   a second conductive layer disposed adjacent to said second insulating layer opposing said first conductive layer; and
   means for providing electrical contacts with said first and third doped regions and with said second conductive layer.

2. The semiconductor floating-gate field-effect transistor of claim 1 in which said first insulating layer covers at least a part of said top parallel surface of said third doped region.

3. The semiconductor floating-gate field-effect transistor of claim 1 in which said first insulating layer has greater thickness adjacent said bottom surface of said trench than adjacent the walls of said trench.

4. The semiconductor floating-gate field-effect transistor of claim 2 in which said first insulating layer has greater thickness adjacent said top parallel surface of said third doped region.

5. The semiconductor floating-gate field-effect transistor of claim 1 in which said surface extension of s id first doped region extends for a predetermined distance away from said trench, then expands to extend to said surface of said semiconductor substrate.

6. The semiconductor floating-gate field-effect transistor of claim 5 in which said surface extension of said first doped region has a deeper depth at a point away from said trench than its depth at said trench.

7. The semiconductor floating-gate field-effect transistor o claim 1 in which said second doped region is electrically connected to said semiconductor substrate.

8. A floating-gate transistor, comprising:
   a semiconductor layer of a second conductivity type containing a trench at a first surface, said trench having sidewalls substantially perpendicular to said first surface;
   a first sourcedrain region within said layer, said first source-drain region doped a first conductivity type, said first source-drain region located with a first portion of said sidewalls forming a part of the boundary of said first source-drain region, and said first source-drain region extending to said surface away from said trench;
   said trench extending through said first source-drain region into said semiconductor layer;
   a channel region within said layer, said channel region doped a second conductivity type opposite said first type, and said channel region located with a second portion of said sidewalls forming a part of the boundary of said channel region, said second portion abutting said first portion, and said channel region extending to said first surface away from said trench;
   a second source-drain region within said layer, said second source-drain region doped said first type, and said second source-drain region located with a third portion of said sidewalls forming a part of the boundary of said second source-drain region, said third portion abutting said second portion, and said second source-drain region extending to said first surface;
   a first gate insulator on said sidewalls at said second portion;
   a first gate on said first gate insulator;
   a second insulator on said first gate and separated from said first gate insulator by said first gate; and
   a second gate on said second gate insulator, said second gate separated from said first gate by said second gate insulator.

9. The transistor of claim 8, wherein:
   said semiconductor layer is P-type silicon;
   said first conductivity type is N-type;
   said first and second gate insulators are silicon dioxide; and
   said first and second gates are polycrystalline silicon.

* * * * *